United States Patent [19]

Lee

[11] 4,228,526
[45] Oct. 14, 1980

[54] LINE-ADDRESSABLE SERIAL-PARALLEL-SERIAL ARRAY

[75] Inventor: Hua-Tung Lee, Poughkeepsie, N.Y.

[73] Assignee: International Business Machines Corporation, Armonk, N.Y.

[21] Appl. No.: 974,634

[22] Filed: Dec. 29, 1978

[51] Int. Cl.$^2$ .................... G11C 9/00; G11C 8/00; G11C 11/34
[52] U.S. Cl. .................... 365/183; 357/24; 365/219; 365/238
[58] Field of Search .................... 365/77, 78, 183, 219, 365/238; 357/24; 307/221 C

[56] References Cited

U.S. PATENT DOCUMENTS

| | | | |
|---|---|---|---|
| 4,011,548 | 3/1977 | Panigrahi | 365/183 |
| 4,094,009 | 6/1978 | Schneider et al. | 365/183 |

Primary Examiner—Stuart N. Hecker
Attorney, Agent, or Firm—Theodore E. Galanthay

[57] ABSTRACT

Disclosed is an electronic data storage of the type wherein data is entered and read out serially. In a conventional serial-parallel-serial configuration, data is serially entered into an input register and then transferred and stored in parallel through the main section of the storage until data is transferred in parallel to the output register from which the data is read serially. In a conventional line-addressable configuration, data is entered into and read from columns of shift registers where each column is addressable. The disclosed array combines the conventional serial-parallel-serial and the line-addressable structures into one array. This permits serial data to be read one row at a time as well as one column at a time.

9 Claims, 27 Drawing Figures

LINE-ADDRESSABLE SERIAL-PARALLEL-SERIAL ARRAY

DESCRIPTION

Technical Field

This invention relates to an electronic data storage array into which data is entered in a serial bit stream and extracted in a serial bit stream. More particularly, data can be read in or out of the array in a serial bit stream in more than one mode because the array of the present invention is operable both as a serial-parallel-serial (SPS) storage and a line-addressable storage (LA).

One object of the present invention is to provide an improved electronic data storage having the desirable features of a serial-parallel-serial data storage as well as those of a line-addressable data storage.

Another object of the present invention is to provide an electronic data storage fabricated from charge coupled devices.

A further object of this invention is to provide an improved electronic data storage from which serial data can be read in more than one mode.

CROSS REFERENCES TO RELATED PUBLICATIONS AND PATENTS

Councill, et al., Application Ser. No. 974,587 filed on the same day with the present application and entitled "Three-Phase Line-Addressable Serial-Parallel-Serial Storage Array".

BACKGROUND ART

In the prior art, charge coupled devices are well known as data storage devices. The use of charge coupled devices is primarily in shift register type storage devices in which data is entered as a serial bit stream at one end of the shift register and read out as a serial bit stream at the output end of the shift register.

An important advance was the serial-parallel-serial charged coupled device shift register. Such a memory includes three essential portions. First, data is entered one bit at a time into a serial input register. Second, data is transferred in parallel from the serial input register into a parallel section. This has been referred to as one row of data in the parallel section. The parallel section typically includes many rows as this is where the bulk of the data is stored. Whereas data bits were initially inserted into the input serial register bit by bit, propagation through the parallel register is row by row. In reality, individual bits propagate along their respective channels which are customarily referred to as columns. These columns are orthogonal to the rows. Third, data is transferred out of the last row of the parallel section into the output serial register from where it is read out serially bit by bit. The output may then be transmitted to a utilization device and/or recirculated to the input of the input serial register for continuous data retention.

The foregoing generally described arrangement, aptly called serial-parallel-serial, has a number of advantages coupled with a number of inherent disadvantages. The advantages include storage density, low cost per bit of storage and reduced power consumption. A principal disadvantage, however, is that there is a long latency period because the order in which bits can be read out is always identical to the order in which bits were originally written in. Thus, if the utilization device requires data that was just written into the serial input register, the entire storage must be cycled before the information is available at the serial output register.

In order to make data more randomly accessible, conventional line-addressable storage arrays were developed. In a line-addressable array, data is inserted into and read out from a line of shift registers. For the sake of description, let these lines be in the same direction as the columns previously defined in the SPS structure. One possible implementation is that alternate columns propagate data in opposite directions resulting in continuous loops provided by each pair of columns. The line-addressable array includes many such loops operating in parallel. As the name implies, the line-addressable array has the flexibility to be read from any one of the columns or loops. Thus, the utilization device has immediate acess to the desired data (zero latency). However, this greatly improved speed of operation as compared to that of a serial-parallel-serial structure is achieved at the expense of a reduced bit density and greater power consumption, resulting in a higher cost per bit.

It is thus apparent that neither the serial-parallel-serial nor the line-addressable organizations provide the optimum desired operating conditions. That is, the high bit density and low cost of the serial-parallel-serial configuration must be sacrificed in order to obtain the operating speed of a line-addressable array. As will become more apparent from the following and more detailed description of the presently disclosed invention, the advantageous aspects of a serial-parallel-serial configuration are retained while the speed of operation of a line-addressable array is also provided.

BRIEF DESCRIPTION OF THE DRAWINGS

In the accompanying drawings forming the material part of this disclosure.

DISCLOSURE OF INVENTION

For further comprehension of the invention, and of the objects and advantages thereof, reference will be had to the following description and accompanying drawings, and to the appended claims in which the various novel features of the invention are more particularly set forth.

Figure 1:
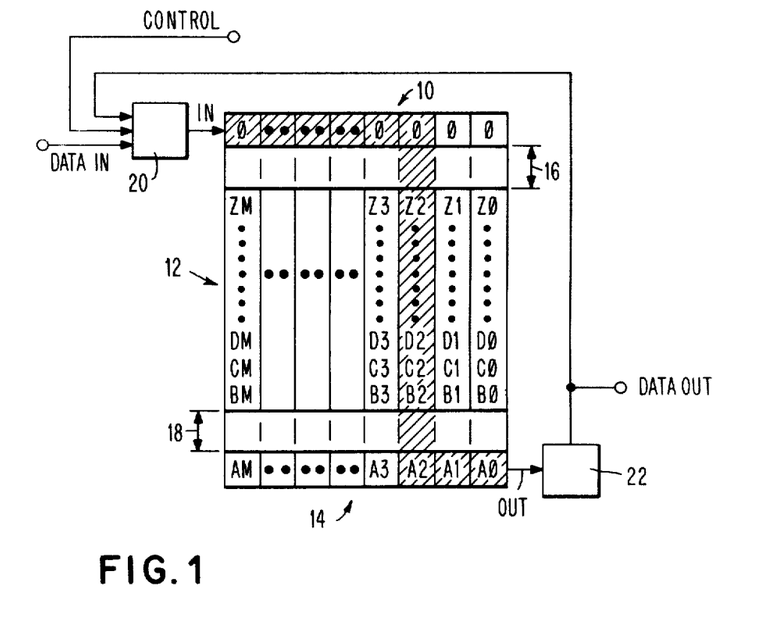
FIG. 1 is a diagrammatic representation showing a system whose quiescent state is defined with empty bits left in the input serial register.

The general conceptual aspects of the invention can be best understood by reference to FIG. 1. FIG. 1 is a schematic representation of a serial-parallel-serial (SPS) type of configuration, including an input serial register 10, a parallel central section 12, and a serial output register 14. Such arrangements frequently include a serial-to-parallel transition region 16 and a parallel-to-serial transition region 18. Gating, timing and charge launching devices for such SPS configurations are well known and are generally represented by block diagram 20. Also well known are charge detection and amplifying devices, including recirculating amplifiers, as illustrated generally by sense amplifier 22. A signal on the control input terminal determines when new data at the data in terminal or recirculated data from sense amplifier 22 is to be inputted into the first bit position in serial register 10. Even in the recirculating mode, data could be simultaneously utilized at the data out terminal.

The present invention is fully operable as a standard SPS array. In the usual and well known manner, data bits are entered serially from left to right into serial input register 10. When the desired number of bits have been entered into register 10, they are transferred in parallel through the serial-parallel transition region 16 into a first row of parallel section 12. New data then is entered into serial register 10 and, in turn, move through the serial-to-parallel transition region 16 into the first row of the parallel section 12 while the data that was previously entered into the first row of parallel section 12 is moved into the second row. In this manner, parallel section 12 is filled with data row by row. As the data first entered reaches the last row in parallel section 12, it is then transferred in parallel through the serial-to-parallel transition region 18 into the serial output register 14. At this point, data is outputted from serial register 14 one bit at a time into sense amplifier 22 and further outputted from sense amplifier 22 both to the data out terminal and to the indicated input of device 20. In the recirculating mode, data at the data out terminal is not utilized. Rather, data bits emanating from sense amplifier 22 are re-entered into serial input register 10 through device 20. Such continuous recirculation of the data bit stream prevents the loss of information in the charge coupled devices.

The intention of this invention is to recirculate data in the conventional manner of SPS structure as was described in the previous paragraph. However, a data record is to be entered and retrieved as illustrated by the shaded path of FIG. 1. For the purpose of detailed description, the bit positions in FIG. 1 have been labeled. The arrangement includes N−1 rows in the parallel section, the first row storing the Z bits while the N−1 th row storing the B bits. (M+1)x N number of bits are stored in total, as the A bits are stored in the serial output register. Each column stores a desired record consisting of data bits A through Z. The shaded cells show a serial path along which a data record is entered or retrieved.

In particular, record 2, i.e. A1 B2 - - - Z2, is shown in its quiescent position. The data record is analogous to the line-addressable column of a conventional line-addressable structure. Note that in this example, the input register 10 has been filled with empty bits designated $\phi$. In accordance with the present invention, it is possible to read out the shaded bits in the following order: A$\phi$, A1, A2, B2 through Z2 and the $\phi$ bits as shown in the shaded portion of the register. As these bits are read out at the data out terminal, they are also recirculated through logic 20 so that at the completion of the operation the exact configuration illustrated in FIG. 1 is re-established. At this point, it is possible either to address another record such as A3 through Z3 or, alternatively, to resume refreshing using the conventional SPS operation. Of course while any desired line is addressed, all other bits in the parallel channels remain inactive, i.e. non-propagating.

It is to be noted that there are (M+1) extra bits in the shaded parts of both the input and the output serial register that must be moved along with the useful record, but will be ignored by the system logic circuits.

In order to explain the present invention in still greater detail, FIGS. 2A-2F go through a complete example in detail. The FIGS. 2A-2F example utilizes the FIG. 1 embodiment in which the empty bits are in the input serial register. Structural elements corresponding to those in FIG. 1 have been numbered with corresponding reference numerals in FIGS. 2A-2F. The transition regions 16 and 18 have been intentionally omitted to simplify the illustration. Also, the nomenclature of the bits has been modified slightly for the same reason.

Figures 2A, 2B, 2C:
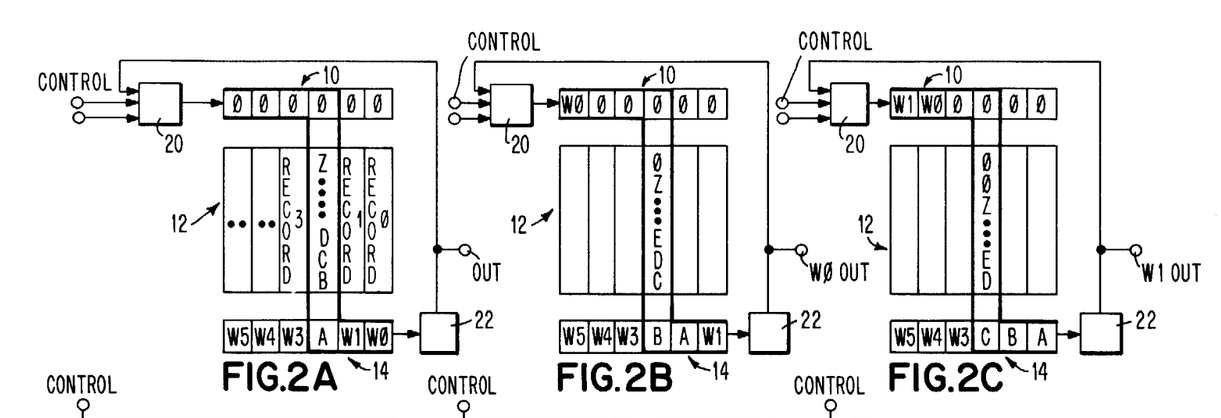
FIGS. 2A through 2F are diagrammatic representations of data flow when the serial-parallel-serial register is operating in a line-addressable mode.

Referring now to FIG. 2A, assume that array record number 2 consisting of bits A, B, C, D through Z is to be the addressed line. Since this is the third array record, a counter at the output terminal in the utilization device would know that bits W$\phi$ and W1 would correspond to the first two array records and are therefore not a part of the addressed line. Thus, as shown in FIG. 2B, bit W$\phi$ is the first bit out and it is also written into the first bit position in serial input register 10 as every bit is shifted by one position. FIG. 2C illustrates the situation when every bit has been shifted one more position with W1 being read out and inserted into the first bit position in serial register 10 while all other bits are correspondingly shifted by one position. At FIG. 2D, the readout of the addressed line begins with the readout of bit A. To better illustrate the condition in which the same data is not to be recirculated, a new bit A designated A' is presented at the input terminal and placed into the first bit position of input register 10. All bits are correspondingly shifted as previously described.

Figures 2D, 2E:
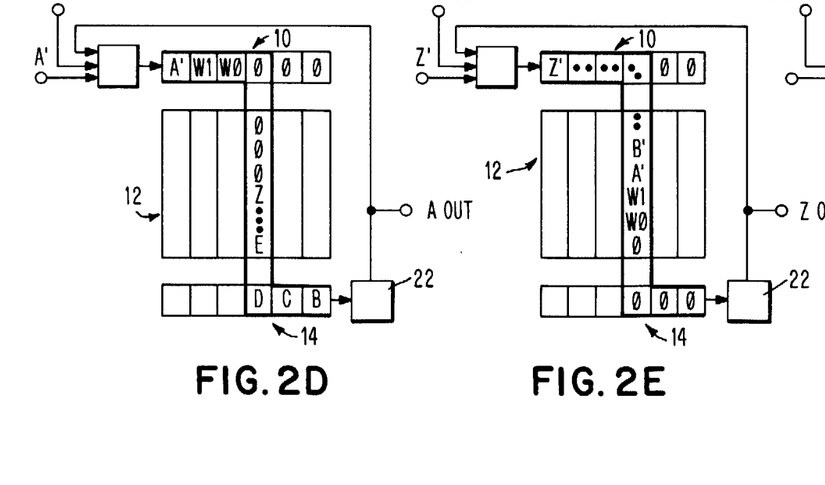
Figure 2F:
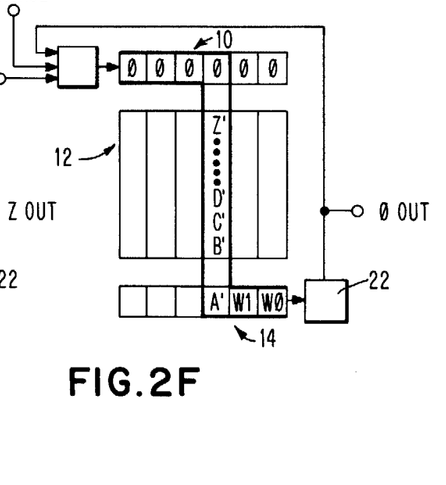

This process of shifting out the desired record continues while the new bits are shifted in, until the condition illustrated in FIG. 2E is reached. Here it is seen that the last bit (Z) has been presented at the data out terminal and the new bit Z' has been inserted into the first position of input register 10. At this point, readout data is complete although several additional cycles are required to shift the data bits back to their original position. This is illustrated in FIG. 2F in which all data bits are back in their original position and bits A', B', C', and D' through Z' have replaced their corresponding unprimed bits in FIG. 2A. In this way, a serial-parallel-serial storage array operates in a line-addressable mode where any one of the desired array records may be addressed at random. The advantages of this structure in reducing latency time is evident. By the conventional SPS mode of operation, if record Z of FIG. 1 is desired, it is necessary to wait until the whole array is accessed. However, by the disclosed LA-SPS mode of operation, if any record of data is desired, the worst case latency is just M bits shifting time. For the case illustrated in FIG. 1, the latency is only the shifting time for bits A$\phi$ and A1. But additional shifting must be performed to restore the data to its original configuration to complete the operation.

Figure 3:
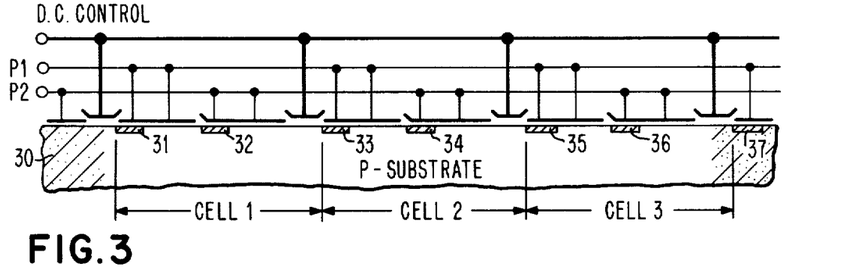
FIG. 3 is a schematic structural representation of three cells implemented in charge coupled device (CCD) technology, the cells being operated in the propagating mode.
Figure 3A:
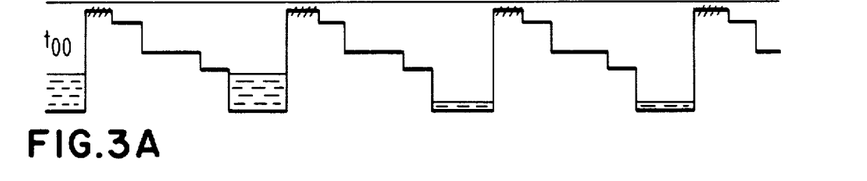
FIGS. 3A–3D are energy level diagrams representive of charge flow in the schematic structure of FIG. 3.

An exemplary structural arrangement for accomplishing this function is best described with reference to the diagrammatic illustration of FIG. 3. FIG. 3 illustrates a typical P-type substrate 30 with P+ type ion implanted impurity regions 31, 32, 33, 34, 35, 36, and 37. The detail of each cell is illustrated at cell 1, cell 2, and cell 3. Each cell has associated therewith three electrodes, including a DC control line, a phase 1 (P1) and a phase 2 (P2). It is well known that by applying three different potential levels to the three different electrodes, three different energy levels can be created in each cell. However, the addition of an ion implant under a portion of the gate permits the creation of two energy levels under that gate. For this reason, ion implant 31 under a portion of the phase 1 gate permits the creation of two separate energy levels under this gate. Similarly, the ion implant 32 under the phase 2 electrode permits the creation of two separate energy levels. The DC control line has a gate without an ion implant under a portion thereof thereby creating only one energy level. In totality, the three electrodes create the possibility of five energy levels in each of the cells. FIG. 3E illustrates the applied potential levels while FIGS. 3A-3D illustrate the propagation of charge through the cells.

Figure 3B:
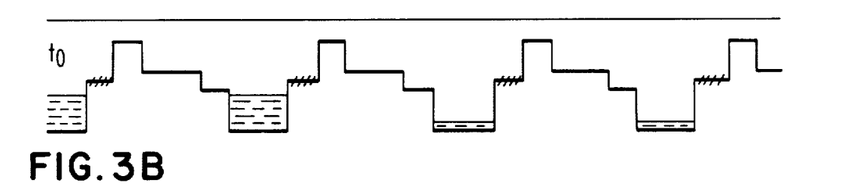
Figure 3C:
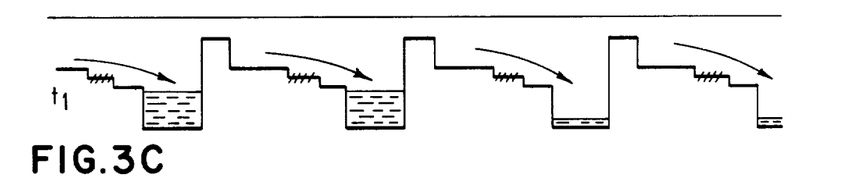
Figure 3D:
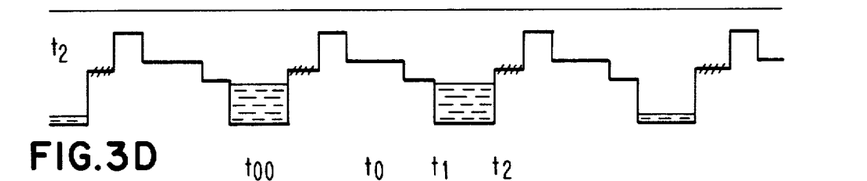
Figure 3E:
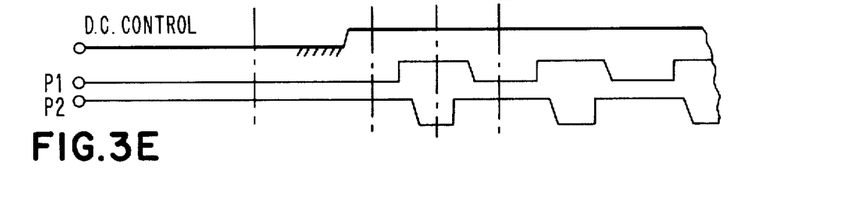
FIG. 3E is a set of waveforms illustrating the control voltage at each of the electrodes in FIG. 3.

FIGS. 3A-3E illustrate the condition in which charge is propagated through the array. This is what happens in each line during SPS operation. In the line addressable mode of operation, FIGS. 3A-3E describe the condition of the addressed line. At time $t_{oo}$, the potential levels illustrated in FIG. 3E are applied. The DC control line is at a down level, the phase 1 line is at a down level, and the phase 2 line is at an up level. This results in the potential well configuration illustrated in FIG. 3A. Also note in FIG. 3A that in the illustrated example a binary 1 is stored in cell 1 as well as the cell preceding cell 1 while fat zeros are stored in cell 2 and cell 3. At time $t_o$, the DC control line is brought to an up level while the phase 1 and phase 2 lines are not altered. This results in a modification of the potential well diagram as illustrated in FIG. 3B. At time $t_1$, the phase 1 electrode has been brough to an up level while the phase 2 electrode has been brought to a down level and the DC control line has been maintained at an up level. This results in the potential well diagram configuration illustrated in FIG. 3C. This causes the transfer of charge in the direction shown by the arrows FIG. 3C.

At time $t_2$, the DC control line is maintained at an up level, the phase 1 line has been brought to a down level, while the phase 2 line has been brought to an up level. This results in the potential well diagram illustrated in FIG. 3D. The transfer of charge is essentially complete with cell 1 containing a binary 1 that was previously in the previous cell; cell 2 containing a binary 1 that was previously in cell 1 and cell 3 containing the fat zero that was previously in cell 2.

Figure 4:
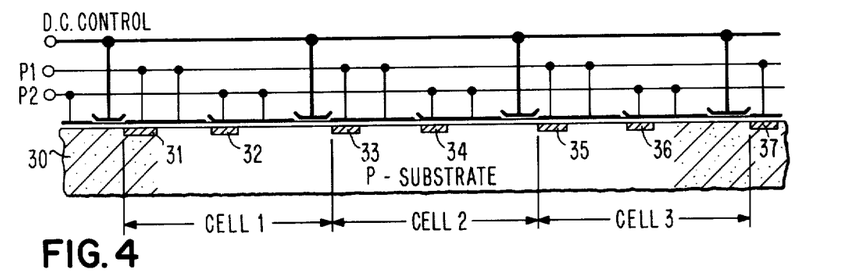
FIG. 4 is a schematic structural representation of three cells implemented in charge coupled device (CCD) technology, the cells being operated in the non-propagating mode.
Figure 4A:
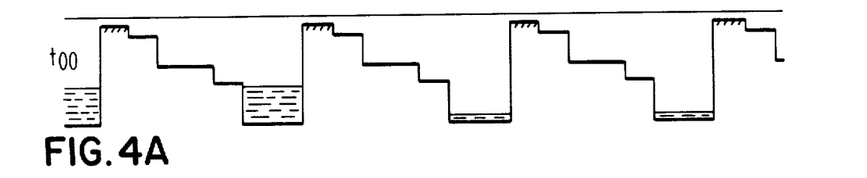
FIGS. 4A–4D are energy level diagrams representative of charge flow in the schematic structure of FIG. 4.
Figure 4B:
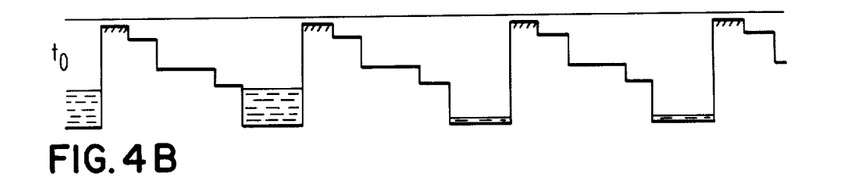
Figure 4C:
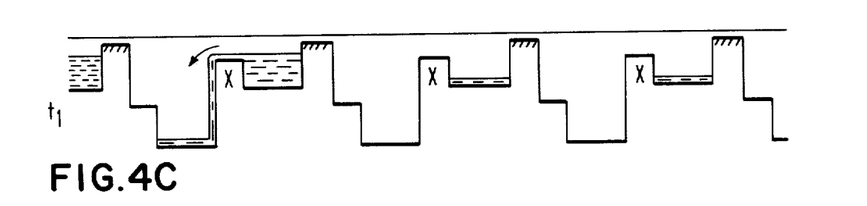
Figure 4D:
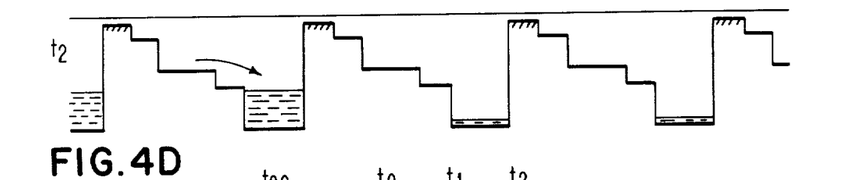
Figure 4E:
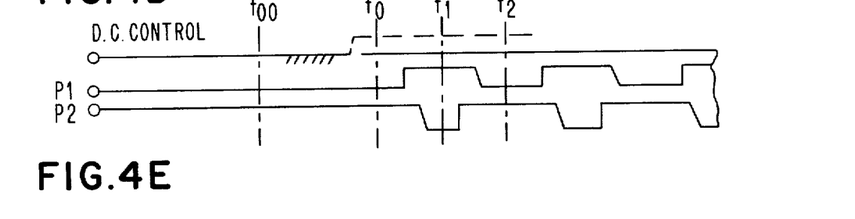
FIG. 4E is a set of waveforms illustrating the control voltage at each of the electrodes in FIG. 4.

Refer now to FIG. 4 which shows the structure identical to FIG. 3. For this reason corresponding elements have been designated with corresponding references. As will become apparent, what is described in conjunction with FIGS. 4 and 4A-4E is the condition in the inactive lines during operation in the line-addressable mode. The initial conditions on the control lines in FIG. 4E are identical to those of FIG. 3E at time $t_{oo}$. Also, the identical binary data is stored in FIG. 4A as was stored in FIG. 3A. For this reason, FIG. 4A is identical to FIG. 3A. At time $t_o$, nothing has been changed from the condition at time $t_{oo}$. For this reason, absolutely no change takes place in the potential well diagrams and FIG. 4B is identical to FIG. 4A.

At time $t_1$, contrary to FIG. 3E, it is noted in FIG. 4E that the DC control line is maintained in the down level while the phase 1 line has been brought to an up level and the phase 2 line has been brought to a down level. This results in the potential well diagram illustrated in FIG. 4C. Note that the well containing the charge representing information is raised to a higher level and the portion of the binary 1 charge exceeding the depth of the well X "sloshes" back into the preceding potential well. At subsequent time $t_2$, the phase 1 line is brought to a down level while the phase 2 line is brought to an up level creating the potential well arrangement illustrated in FIG. 4D. Note that this is identical to FIG. 4B. By this technique, the potential well arrangement can be made to vary back and forth between the FIG. 4C and the FIG. 4D arrangements, thereby maintaining the information "stationary" in all unselected lines. This is the condition that will prevail in all lines where the DC control line is kept at a down level. Thus, the DC control line performs an inhibit function and might equally well be referred to as an inhibit line when used in this manner. The address selection circuitry will permit the inhibit line to be brought to an up level only in the selected line while it is maintained at a down level in all other lines.

Figure 5:
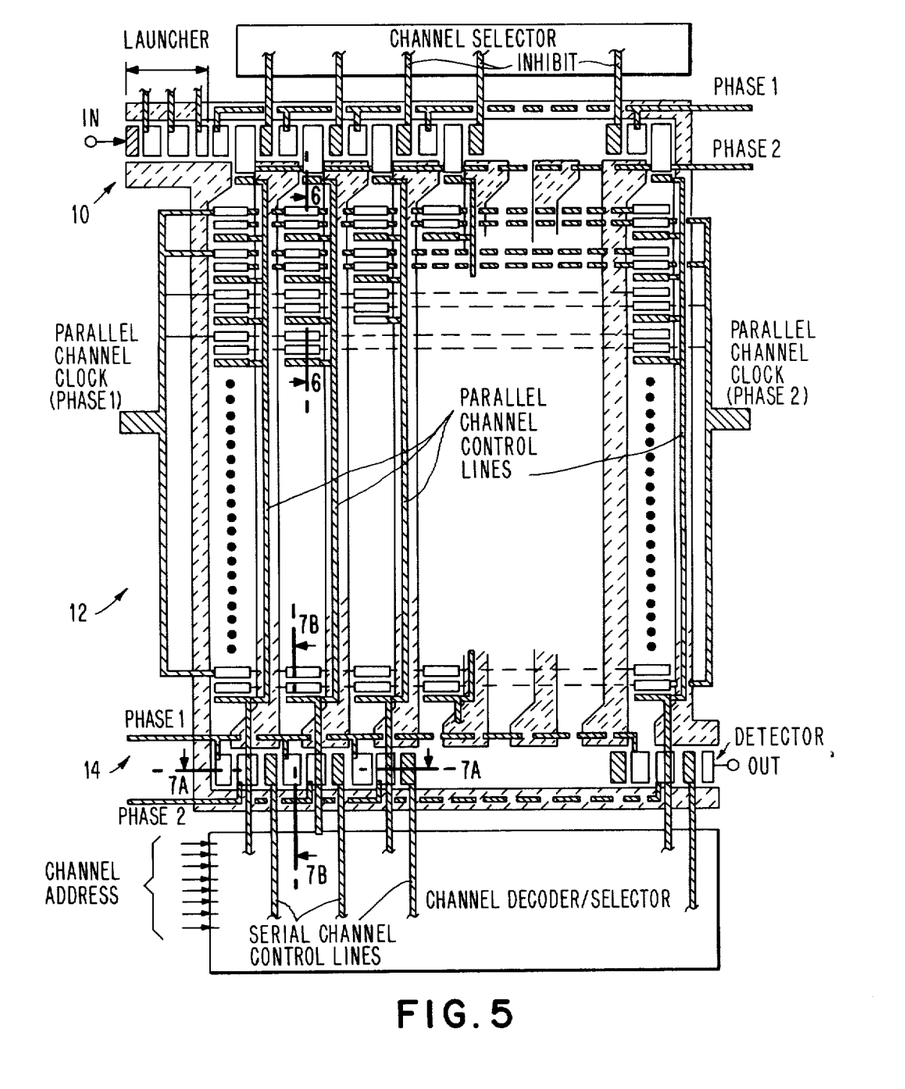
FIG. 5 is a structural diagram illustrating the horizontal topography of the serial-parallel-serial line-addressable storage of this invention.

Refer now to FIG. 5 for the description of an exemplary horizontal topography suitable for performing the SPS as well as line addressable modes of operation. Conventional and well known operations such as transfers within a serial register, transfers within a parallel register, and serial-to-parallel and parallel-to-serial transfers, as well as the details of charge launching and detection will not be dealt with at length. These are well known to those skilled in the art.

One aspect of the FIG. 5 configuration is the use of DC controlled charge coupled devices for the line addressable SPS array. Such DC controlled CCD's require a singular DC control line to each parallel channel while allowing the use of commoned clock lines for all parallel channels as is the real asset of an SPS array. This is a very significant factor, for it permits a high density array design. That is, over and above whatever circuitry/space savings that are attributable directly to the employment of the line-addressable serial-parallel-serial array concept.

Thus, FIG. 5 primarily shows the running of the clock and control lines. The serial input register 10, the parallel section 12, and the serial output register 14 are again numbered with reference numerals corresponding to previous drawing figures as they refer to identical structural elements. Input serial register 10 is seen receiving an input into a launcher section thereof and the connection of phase 1 and phase 2 electrodes. Added to the conventional two-phase serial input register are the inhibit lines emanating from the channel selector. These are the previously described DC control lines which must be selectively activated during the line-addressable mode of operation. There will be transfer of data bits in all of the input serial registers during an SPS mode of operation and selective transfer during the line-addressable mode of operation depending on which line is being addressed as illustrated previously, for example, in the description of FIG. 1. The two groups of cells of input serial register 10 are configured in the manner previously described with reference to FIGS. 3 and 4.

In the parallel section, the one selected column and all the other columns of cells are also configured, respectively, as previously described with reference to FIGS. 3 and 4. The connection of the phase 1 and phase 2 parallel channel clock lines is specifically shown. The timing relationship of the phase 1 and phase 2 lines in the serial and parallel sections is selected as desired and depending on the particular manner in which the serial-to-parallel transfer is desired to take place. (See FIGS. 3E and 4E). Specifically note the parallel channel control lines running along the length of every column. These parallel channel control lines correspond to the DC control lines previously described with reference to FIGS. 3 and 4. It is seen that by having one of these lines in every column in the parallel section, it is possible to activate any selected column while inhibiting all others to perform the line-addressable mode of operation. These parallel channel control lines are controlled by the channel decoder/selector which receives a channel address input. The channel decoder/selector also controls the serial channel control lines in the serial output register. Thus, after bits are transferred from the last row of the parallel central section 12 (either in parallel as in SPS operation or one bit at a time as in line-addressable operation), they are serially shifted out from the serial output register 14 by means of the phase 1 and phase 2 clock pulses through the detector to the output terminal.

Figure 6:
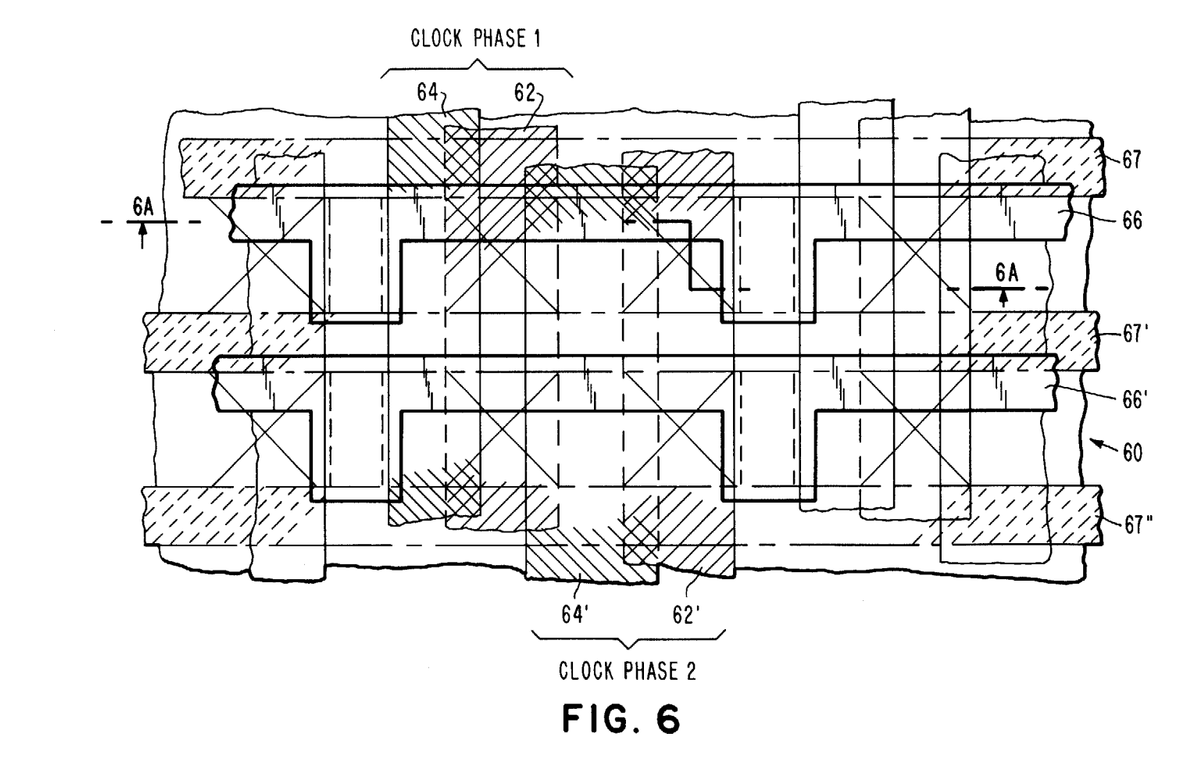
FIG. 6 is an enlarged portion of the FIG. 5 structure in the area illustrated by section line 6.

Refer now to FIG. 6 which is an enlarged portion of the FIG. 5 structure in the area of section line 6. Portions of two parallel columns are shown in FIG. 6. Substrate 60 is typically doped with P-type impurities although it is also known to fabricate CCD's with N-type substrates. In accordance with known lithographic techniques, ion implants (not shown), the various polysilicon electrodes and the metal electrodes are formed in the arrangement shown. The phase 1 clock lines are formed with polysilicon electrodes 62 and 64. Electrode 62 is referred to as poly 1 while electrode 64 is referred to as poly 2. This designation is determined by the order in which the various polysilicon electrodes are formed with various silicon dioxide insulating layers therebetween. The phase 2 clock lines are formed by polysilicon electrodes 62' and 64'. Electrode 62' is poly 1 while electrode 64' is poly 2. The top layer conductor (usually formed from metal) is inhibit line 66 for one column and inhibit line 66' for the other column. The first column is separated from the second column by recessed oxide isolation 67'. The first column is separated from its other adjacent column by recessed oxide 67 while the second illustrated column is separated from its next adjacent column by recessed oxide 67''. Recessed oxide isolation as well as other types of isolation between columns in a parallel array are well known. All such known techniques of isolating one column from another are useful for this invention as the overall structure conforms to known SPS arrays in all possible respects except for the added line-addressable feature described herein.

Figure 6A:
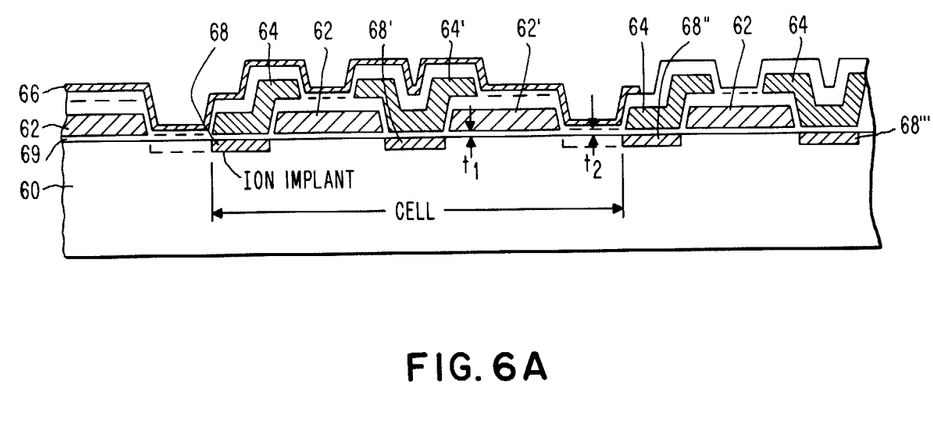
FIG. 6A is a vertical section of FIG. 6 along section line 6A.

For a more complete understanding of the FIG. 6 structure, refer now to FIG. 6A which is a vertical section of the FIG. 6 structure along section line 6A. FIG. 6A is a more detailed representation of the schematic equivalent previously described with reference to FIGS. 3 and 4. On substrate 60 are formed the various electrodes 62, 64, and 66 as well as the various ion implants 68, 68', etc. With a P−type substrate, the ion implants are P+ type. Electrodes 62 are poly 1 while electrodes 64 are poly 2. The inhibit electrode is usually metal although triple poly structures are known and electrode 66 fabricated from polysilicon material would also be acceptable. The various electrodes as well as the substrate are suitably insulated from each other by silicon dioxide, for example.

A typical cell has been identified in FIG. 6A to correspond to cell 1, for example, in FIGS. 3 and 4. The phase 1 electrode (P1) includes both poly 1 (62) and poly 2 (64) and clarifies the two electrode connection shown in the schematic diagrams of FIG. 3 and FIG. 4. Underneath poly 2 electrode 64, ion implant 68 has been formed. The phase 2 (P2) terminal is connected to electrodes 62' (poly 1) and 64' (poly 2), the latter being formed over ion implant 68'. The last connection for this cell is the DC control (inhibit) electrode 66. The thin oxide layer 69 need not be uniform throughout, for example, a first thickness $t_1$ under the polysilicon electrodes 62 and 64 can be in the order of 500 Angstroms. A second thickness $t_2$ under the control (inhibit) metallic electrodes can be in the order of 1000 Angstroms.

Figure 7:
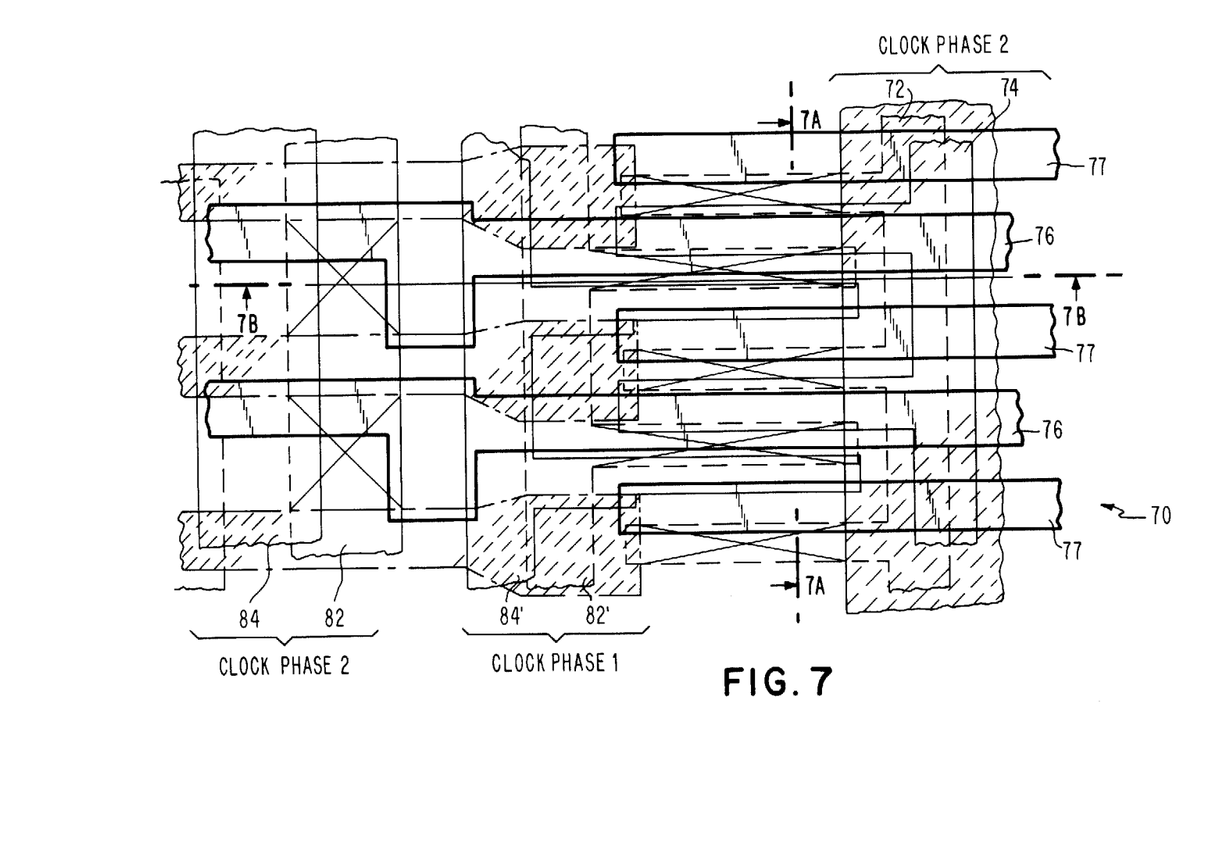
FIG. 7 is an enlarged portion of FIG. 5 in the area illustrated by section lines 7A and 7B.

Refer now to FIG. 7 which is a horizontal topography enlarged from FIG. 5 in the area of section lines 7A and 7B. In FIG. 7, the substrate has been identified as reference numeral 70. The enlarged area shown in FIG. 7 includes a portion of the parallel channel, a portion of the transition region, and a portion of the serial channel. In FIG. 7, along section line 7B, is shown a portion of the parallel channel, a portion of the transition region, and a portion of the serial channel. Also in FIG. 7 along section line 7A is shown a portion of the serial channel only.

Figure 7A:
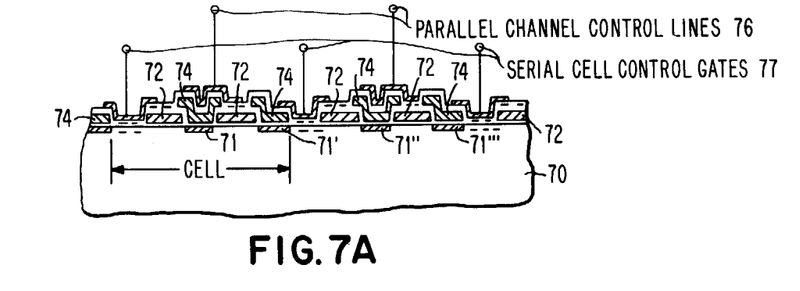
FIG. 7A is a vertical section of the enlarged horizontal layout of FIG. 7 along section lines 7A.
Figure 7B:
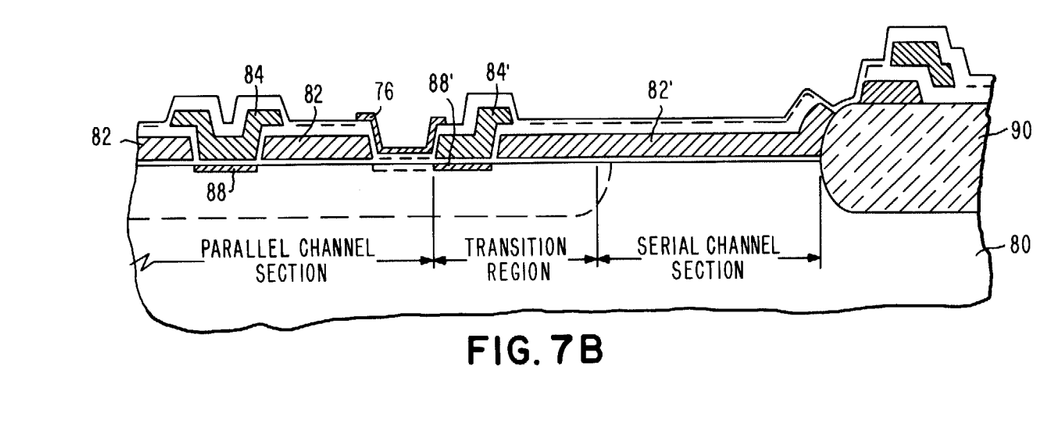
FIG. 7B is a vertical section of the horizontal layout along section line 7B in FIG. 7.

In the portion of the parallel channel illustrated in FIGS. 7, 7A and 7B, the phase 2 clock lines are formed by electrodes 82 and 84. Electrode 82 is poly 1 while electrode 84 is poly 2. In the transition region, the phase 1 clock electrodes 82' and 84' are formed by poly 1 and poly 2, respectively. In the serial channel, the phase 2 clock electrodes 72 and 74 are formed by poly 1 and poly 2, respectively. The parallel channel control (inhibit) lines 76 extend from the parallel channel over the serial channel but have no effect on the serial channel by virtue of being separated from the substrate by a thick oxide. The serial control gates 77, however, are located only in the serial channel region and perform the same inhibit or transfer function as previously described for the parallel channel control lines.

For a more detailed description of the serial channel, refer again to FIG. 7A which is a vertical section along section line 7A in FIG. 7. A portion of the serial output register is shown. (It is understood that the serial input register has identically structured cells). Thus, into Ptype substrate 70 are formed a plurality of P+ type ion implants 71, 71', 71'' and 71'''. A typical cell has again been identified. Suitably insulated from each other by silicon dioxide, for example, are the polysilicon 1 electrodes 72 and the polysilicon 2 electrodes 74. The parallel channel control lines 76 are separated from the substrate not only by a thick oxide but also by the respective polysilicon electrodes and therefore have no effect on charge propagation. The serial control lines 77, however, are separated from the substrate only by a thin oxide. It is understood that the thin oxide separating the metal gates from the substrate may be of a thickness in the order of 1000 Angstroms while the thin oxide separating the polysilicon electrodes from the substrate may be in the order of 500 Angstroms. The typically illustrated cell in FIG. 7A has as its control electrode the serial control gates 77. The phase 2 clock line is connected to both poly 1 electrode 72 and the poly 2 electrode 74, which is positioned substantially over the ion implant 71. The phase 1 control line is connected to poly 1 electrode 72 and poly 2 electrode 74, which is positioned substantially over ion implant 71'. With this arrangement, charge propagation would be from right to left.

Refer again to FIG. 7B which shows a section of FIG. 7 along section line 7B. In the parallel channel section, the electrodes for clock phase 2 are formed by poly 1 electrode 82 and poly 2 electrode 84, which is positioned substantially over ion implant 88. The clock phase 1 electrodes are formed by the partially shown poly 1 electrode 82 with another poly 2 electrode (not shown. The control gate 76 forms the inhibit contact to the illustrated cell in the parallel channel section. In the transition region, phase 1 clock electrodes are formed by poly 1 electrode 82' and poly 2 electrode 84', which is positioned substantially over ion implant 88'. The serial channel section can be better understood by reference to FIG. 7A. However, in FIG. 7B there is shown to the right of the serial channel section a typical recessed oxide isolation 90. The substrate in FIG. 7B has been identified with reference numeral 80.

In the foregoing description, a two phase implementation is described. Commoned clock lines are utilized for each column of storage as is customary with conventional SPS arrays. This preserves the high density attributes of SPS arrays. The addition of a DC control line to each channel is all that is required for the added flexibility of line addressable operation. The use of a third level conductor for the DC control (inhibit) gates is not a significant burden on an existing SPS array. Since a metal level is ordinarily an integral part of the standard double polysilicon self-aligned gate CCD fabrication process, the use of metal for the DC control gates is most convenient. It should, however, be noted that the use of metal gates on thin oxide is more reliable if the thin oxide under the metal is made thicker than the thin oxide under the polysilicon. This is due to the fact that the DC control gates need to vary the entry level under themselves by only about one-half as much as those under the polysilicon gates. By having a thicker thin oxide under the metal gates, the same applied DC voltage will provide a lesser energy variation under the metal gates. Alternatively, smaller DC voltages could be applied to the metal gates permitting equal thickness thin oxide to be used throughout. Those skilled in the art will recognize the relative voltage levels required for clock phases 1 and 2 and the DC control gates in order to provide the illustrated potential barriers under the various control gates. For example, the down level of both the phase 1 and phase 2 clock signals must be of a sufficiently high voltage so that the directivity barrier under the ion implant areas shall not exceed that under the DC control gates. Those skilled in the art also recognize that directionality can be provided in a two phase CCD with techniques other than ion implants such as thin/thick oxide offset gate configurations.

Figure 8:
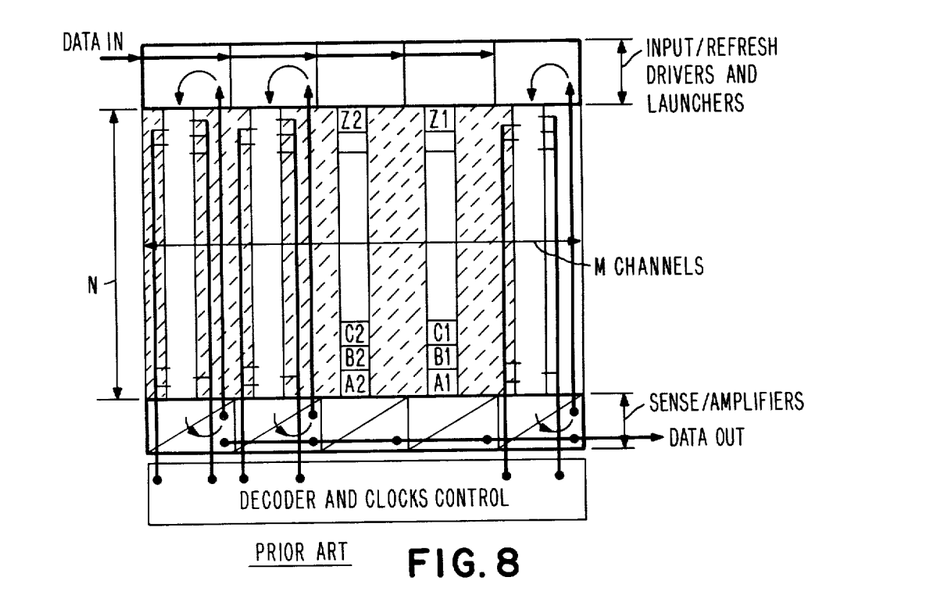
FIG. 8 illustrates a prior art line-addressable array.

The foregoing description illustrates the modification of an SPS array to form a line addressable SPS array. As an alternative, a line addressable array may be modified to also include an SPS function. Such an arrangement is described briefly. As shown in the FIG. 8 prior art illustration, a line addressable array receives data in series and stores it in the various loops. There is a requirement for input/refresh drivers and launchers for each loop (at the input end) and sense amplifiers for each loop (at the output end).

Figure 9:
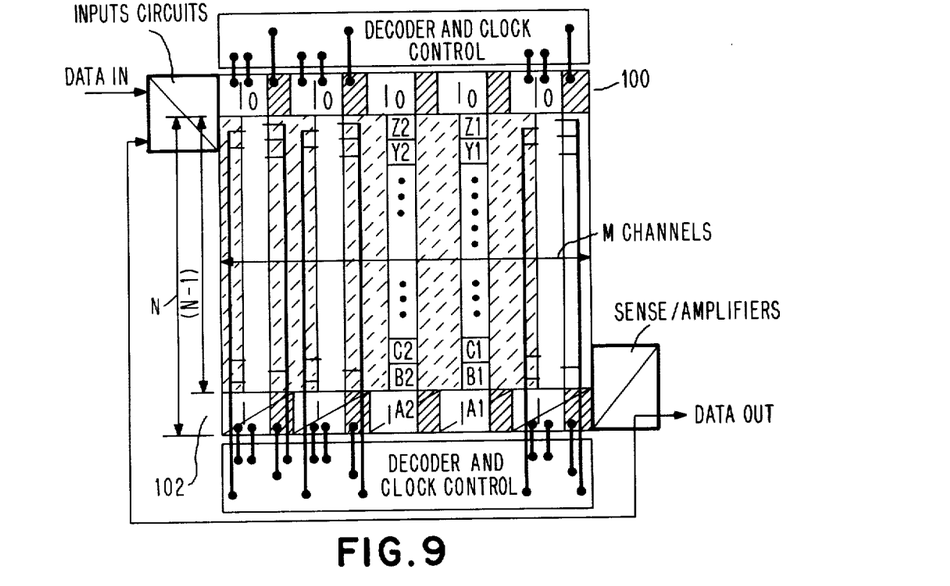
FIG. 9 is an alternate embodiment of the line-addressable serial-parallel-serial array of this invention.

As shown in FIG. 9, an input serial register 100 and an output serial register 102 are added and the individual input/refresh drivers and launchers (at the input end) and the individual sense amplifiers (at the output end) are eliminated. In the read/write operation of the array of FIG. 9, the unselected parallel channels are absolutely inactive (in contrast to effectively standing still in the DC control preferred embodiment). The arrangement in FIG. 9, however, loses the density advantages provided by the preferred embodiment. Most significantly, known types of line addressable memories require extensive wiring space for the operation of each channel separately. Thus, an important advantageous feature of the preferred embodiment is not preserved.

While I have illustrated and described the preferred embodiment of my invention, it is to be understood that I do not limit myself to the precise construction herein disclosed and the right is reserved to all changes and modifications coming within the scope of the invention as defined in the appended claims.

Having thus described the invention, what is claimed as new and desired to be secured by Letters Patent is:

1. A line addressable serial parallel serial storage array comprising:
   a serial input register for accepting data bits at an input;
   a serial output register for providing data bits at an output;
   a parallel register between said input and said output registers for receiving data bits from said serial input register and for transferring data bits to said serial output register;
   first and second phase lines connected to each said registers; and
   control lines connected to each said registers, each one of said control lines being adapted to selectively inhibit the propagation of data bits in said registers.

2. A line addressable serial parallel serial storage array as in claim 1 wherein:
   the first and second phase lines connected to the parallel register are arranged in parallel to each other, each said phase lines being associated with one row of said parallel register.

3. A line addressable serial parallel serial storage array as in claim 2 wherein the control lines connected to the parallel register are arranged in parallel to each other, orthogonal to said phase lines, each said control lines being associated with one column of said parallel register.

4. A line addressable serial parallel serial storage array as in claim 3 wherein:

said phase lines are fabricated from a polycrystalline silicon material; and said control lines are fabricated from a metallic material.

5. A line addressable serial parallel serial storage array as in claim 4 wherein:

each one of said first and second phase lines are connected to corresponding ones of a plurality of gate electrodes along each row of said parallel register;

each one of said control lines being connected to a corresponding one of a plurality of gate electrodes along each one of said columns in said parallel register;

each one of said gate electrodes connected to each one of said phase lines being formed from a polycrystalline silicon material;

each one of said gate electrodes connected to each one of said control lines being formed from a metallic material.

6. A line addressable serial parallel serial storage array as in claim 5 wherein:

the gate electrodes associated with each said control lines are adapted to be dimensioned smaller than any of the electrodes associated with the first and second phase lines.

7. A line addressable serial parallel serial storage array as in claim 6 formed on a semiconductor substrate wherein:

each of said gate electrodes is separated from said substrate by a layer of silicon dioxide material.

8. A line addressable serial parallel serial storage array as in claim 7 further comprising:

ion implanted regions formed in said substrate under portions of the gate electrodes associated with said first and second phase lines.

9. A line addressable serial parallel serial storage array as in claim 7 wherein:

said thin layer of silicon dioxide material is dimensioned thicker under the metallic gate electrodes.

* * * * *